(12) United States Patent
Kasugai

(10) Patent No.: US 10,973,128 B2
(45) Date of Patent: Apr. 6, 2021

(54) FLEXIBLE PRINTED CIRCUIT AND IMAGING APPARATUS INCLUDING SAME

(71) Applicant: Panasonic Intellectual Property Management Co., Ltd., Osaka (JP)

(72) Inventor: Hiroki Kasugai, Osaka (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 14 days.

(21) Appl. No.: 16/055,052

(22) Filed: Aug. 4, 2018

(65) Prior Publication Data
US 2019/0069413 A1    Feb. 28, 2019

(30) Foreign Application Priority Data

Aug. 30, 2017  (JP) .............................. JP2017-165704
Apr. 16, 2018  (JP) .............................. JP2018-078495

(51) Int. Cl.
| H05K 1/18 | (2006.01) |
| H05K 1/14 | (2006.01) |
| H05K 1/02 | (2006.01) |
| H05K 5/02 | (2006.01) |
| H04N 5/235 | (2006.01) |

(Continued)

(52) U.S. Cl.
CPC .......... *H05K 1/189* (2013.01); *H04N 5/2254* (2013.01); *H04N 5/2256* (2013.01); *H04N 5/2354* (2013.01); *H04N 5/335* (2013.01); *H05K 1/0256* (2013.01); *H05K 1/147* (2013.01); *H05K 5/0247* (2013.01); *H05K 5/06* (2013.01); *H05K 1/0393* (2013.01); *H05K 1/148* (2013.01); *H05K 2201/0129* (2013.01); *H05K 2201/0145* (2013.01); *H05K 2201/0154* (2013.01); *H05K 2201/0195* (2013.01); *H05K 2201/055* (2013.01); *H05K 2201/10121* (2013.01)

(58) Field of Classification Search
None
See application file for complete search history.

(56) References Cited

U.S. PATENT DOCUMENTS

| 5,814,894 A | * | 9/1998 | Igarashi | ................ H01L 21/563 257/778 |
| 2006/0044735 A1 | * | 3/2006 | Hayashi | ............ H01L 23/49827 361/313 |

(Continued)

FOREIGN PATENT DOCUMENTS

| JP | 6-268338 | 9/1994 |
| JP | 9-061895 A | 3/1997 |

(Continued)

OTHER PUBLICATIONS

The Extended European Search Report dated Jan. 30, 2019 for the related European Patent Application No. 18191161.1.

*Primary Examiner* — Mark T Monk
(74) *Attorney, Agent, or Firm* — Renner, Otto, Boisselle & Sklar, LLP

(57) ABSTRACT

The flexible printed circuit includes a first insulator including a first insulating layer, a second insulator including a second insulating layer, and a wiring layer formed of a conductive material. Each of the first insulator and the second insulator meets IEC 60950. The flexible printed circuit includes a region where insulation of the wiring layer is required, the region is hermetically sealed by the first insulator and the second insulator.

18 Claims, 15 Drawing Sheets

(51) Int. Cl.
- *H04N 5/225* (2006.01)
- *H05K 5/06* (2006.01)
- *H04N 5/335* (2011.01)
- *H05K 1/03* (2006.01)

(56) References Cited

U.S. PATENT DOCUMENTS

| | | | | |
|---|---|---|---|---|
| 2006/0050448 | A1* | 3/2006 | Krug | G05F 1/571 |
| | | | | 361/18 |
| 2006/0131745 | A1* | 6/2006 | Yutani | H01L 21/485 |
| | | | | 257/737 |
| 2009/0176080 | A1 | 7/2009 | Lai et al. | |
| 2010/0259201 | A1* | 10/2010 | Kawano | H01L 23/49575 |
| | | | | 315/362 |
| 2011/0162864 | A1* | 7/2011 | Kaneda | F16J 15/064 |
| | | | | 174/50.59 |
| 2013/0020660 | A1* | 1/2013 | Milano | G01R 15/207 |
| | | | | 257/427 |
| 2014/0218019 | A1* | 8/2014 | Ausserlechner | G01R 15/20 |
| | | | | 324/251 |
| 2016/0072992 | A1* | 3/2016 | Doshin | H04N 5/2256 |
| | | | | 348/371 |

FOREIGN PATENT DOCUMENTS

| | | |
|---|---|---|
| JP | 11-258657 | 9/1999 |
| JP | 2012-028601 | 2/2012 |
| JP | 2012-038710 | 2/2012 |
| JP | 2017-049935 | 3/2017 |

\* cited by examiner

FIG. 15

| GRADE OF INSULATING MATERIAL | APPLICABLE PORTION (IF APPLICABLE) | | | | |
|---|---|---|---|---|---|
| | BETWEEN "PRIMARY CIRCUIT" AND "DEVICE BODY", BETWEEN "PRIMARY CIRCUIT" AND "SECONDARY CIRCUIT", AND BETWEEN PORTIONS OF "PRIMARY CIRCUIT" | | | | |
| | "WORKING VOLTAGE" U, PEAK OR DC | | | | |
| | 210 V OR LESS[a] | OVER 210 V AND NOT MORE THAN 420 V[b] | OVER 420 V AND NOT MORE THAN 1.41 kV | OVER 1.41 kV AND NOT MORE THAN 10 kV[c] | OVER 10 kV AND NOT MORE THAN 50 kV |
| | TEST VOLTAGE, VOLT AC EFFECTIVE VALUE | | | | |
| "REINFORCED INSULATION" | 2000 | 3000 | 3000 | WRITTEN IN $V_b$ IN PART 2, TABLE 5B (NOT ATTACHED) | 1.06 U |

FLEXIBLE PRINTED CIRCUIT AND IMAGING APPARATUS INCLUDING SAME

BACKGROUND

1. Technical Field

The present disclosure relates to a flexible printed circuit and an imaging apparatus including the flexible printed circuit.

2. Description of the Related Art

Unexamined Japanese Patent Publication No. 1111-258657 (PTL 1) discloses a camera including an electronic flash light emitting unit in an electronic flash device that emits electronic flash light toward a subject, an image sensor, and an image display device that displays a finder image based on an image signal acquired from the image sensor. This camera also includes a housing into which the image display device is incorporated and which is attached to a camera body so as to be freely raised and lowered. The electronic flash light emitting unit is incorporated in the housing. The camera is configured such that, when the housing is raised, a display surface of the image display device faces rearward of the camera body and an electronic flash light emission surface of the electronic flash light emitting unit faces forward of the camera body. PTL 1 indicates that the image display device and the electronic flash light emitting unit are electrically connected to a circuit provided in the camera body using, for example, a flexible printed circuit (see Unexamined Japanese Patent Publication No. 2012-28601 (PTL 2), for example).

SUMMARY

In a case where the circuit in the camera body and the electronic flash light emitting unit that requires a high voltage are connected to each other using a flexible printed circuit (FPC) as in PTL 1, the flexible printed circuit is demanded to have high insulation properties. For example, International Electrotechnical Commission (IEC) 60950 which is an IEC standard defines insulation for a high-voltage portion in an information processing device.

Conventionally, an insulation tape is wound around a flexible printed circuit in order to ensure insulation properties complying with the IEC 60950 standard. Therefore, a thickness of the flexible printed circuit is increased, which inhibits downsizing of an electronic device including the flexible printed circuit. In addition, due to the insulation tape being wound, workability in an assembling operation is low.

The present disclosure provides a flexible printed circuit that ensures high insulation properties with a reduced thickness. The present disclosure also provides an imaging apparatus including the flexible printed circuit.

A first aspect of the present disclosure provides a flexible printed circuit. The flexible printed circuit includes: a first insulator formed of resin and including a first insulating layer; a second insulator formed of resin and including a second insulating layer; and a wiring layer disposed between the first insulating layer and the second insulating layer and formed of a conductive material. Each of the first insulator and the second insulator meets International Electrotechnical Commission (IEC) 60950 that is an IEC standard. The flexible printed circuit includes a region where insulation of the wiring layer is required, the region is hermetically sealed by the first insulator and the second insulator.

The flexible printed circuit includes the region where the wiring layer is insulated by the first insulator and the second insulator, the first insulator and the second insulator sealing the wiring layer.

A second aspect of the present disclosure provides an imaging apparatus including the flexible printed circuit. The imaging apparatus includes: a main body; an electronic flash unit is stored in the main body or protrudes from the main body to emit flashlight; a circuit that is stored in the main body and configured to supply a power source to the electronic flash unit; and the flexible printed circuit that electrically connects the electronic flash unit and the circuit to each other.

The present disclosure can achieve a flexible printed circuit that ensures high insulation properties with a reduced thickness. Therefore, when such a flexible printed circuit is used for an electronic device, the electronic device can be downsized.

BRIEF DESCRIPTION OF THE DRAWINGS

FIG. 15 is a diagram showing an abstract of excerpts from IEC 60950.

DETAILED DESCRIPTION

Exemplary embodiments will be described in detail below with reference to the drawings. However, unnecessarily detailed descriptions may be omitted. For example, a detailed description of well-known matters, and a duplicate description of substantially identical configurations may not be provided. This is to avoid unnecessary redundancy in the following description and to facilitate understanding of those skilled in the art.

The inventor of the present disclosure provides the appended drawings and the following description in order to allow those skilled in the art to fully understand the present disclosure, and does not intend to limit the subject matter described in the appended claims by the appended drawings and the following description.

[1-1. Digital Camera]

Figure 1:
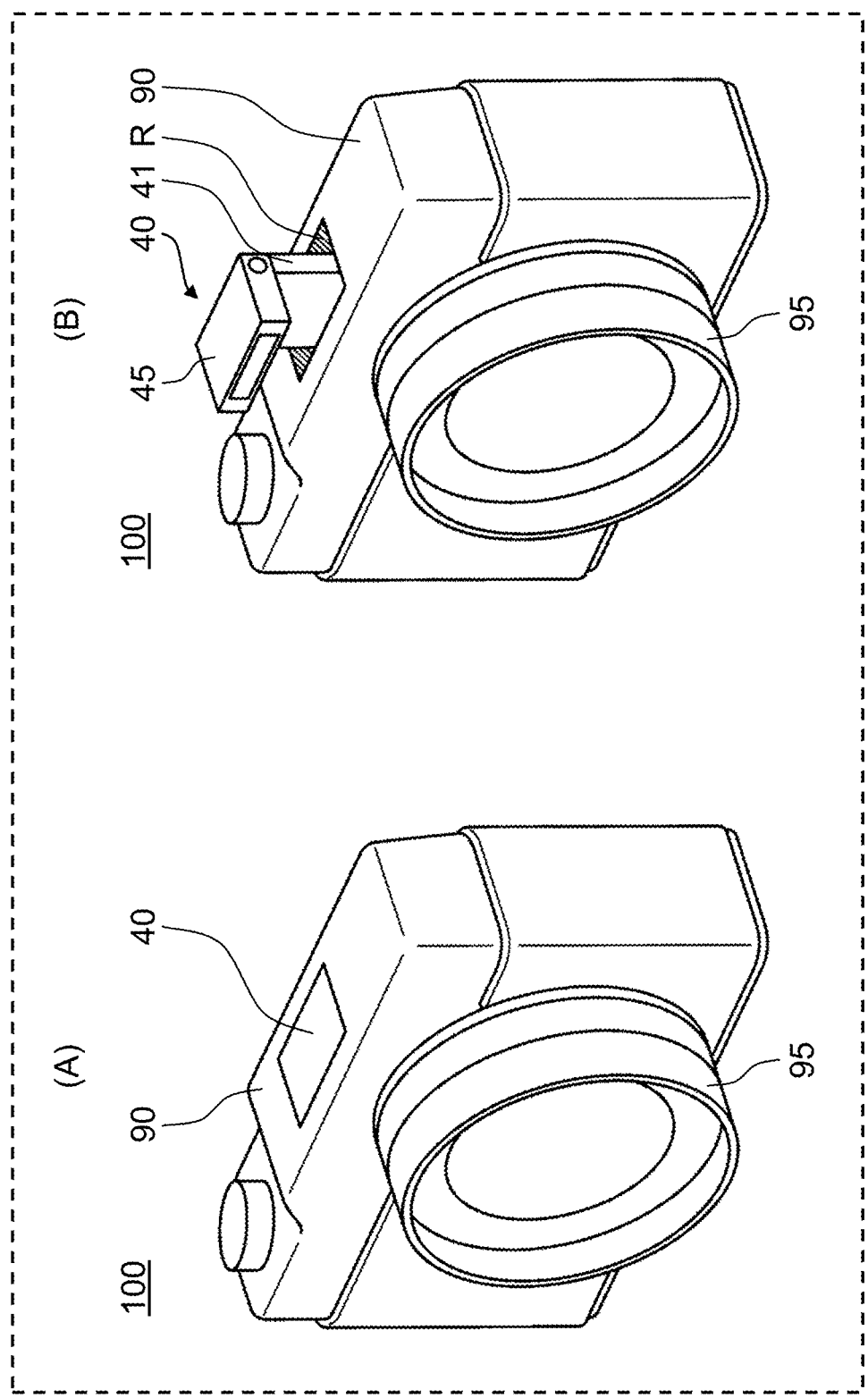
FIG. 1 is a perspective view of a digital camera including a flexible printed circuit according to the present disclosure, wherein part (A) shows a state where an electronic flash unit is stored, and part (B) shows a state where the electronic flash unit pops up.

FIG. 1 is a perspective view of a digital camera including a flexible printed circuit according to an exemplary embodiment of the present disclosure. Digital camera 100 is an apparatus that captures an image of a subject to generate data of a still image or a moving image and records the generated data in a recording medium such as a memory card.

As shown in FIG. 1, digital camera 100 includes camera body 90 provided with lens barrel 95 on a front surface. Digital camera 100 also includes electronic flash unit 40 that emits flashlight toward a subject. When not in use, electronic flash unit 40 is in a state (first state) of being stored in storage space R formed in a central upper part of camera body 90 as shown in part (A) of FIG. 1. When in use, electronic flash unit 40 is in a state (second state) of popping up from camera body 90 as shown in part (B) of FIG. 1.

Electronic flash unit 40 includes electronic flash light emitting unit 45 that emits flashlight, and arm unit 41 that supports electronic flash light emitting unit 45. Arm unit 41 includes a plurality of members. These members are connected to one another. Arm unit 41 is freely foldable in a zigzag manner. The configuration described above enables electronic flash unit 40, that is, electronic flash light emitting unit 45 and arm unit 41, to be stored in camera body 90 or to pop up from camera body 90.

Figure 2:
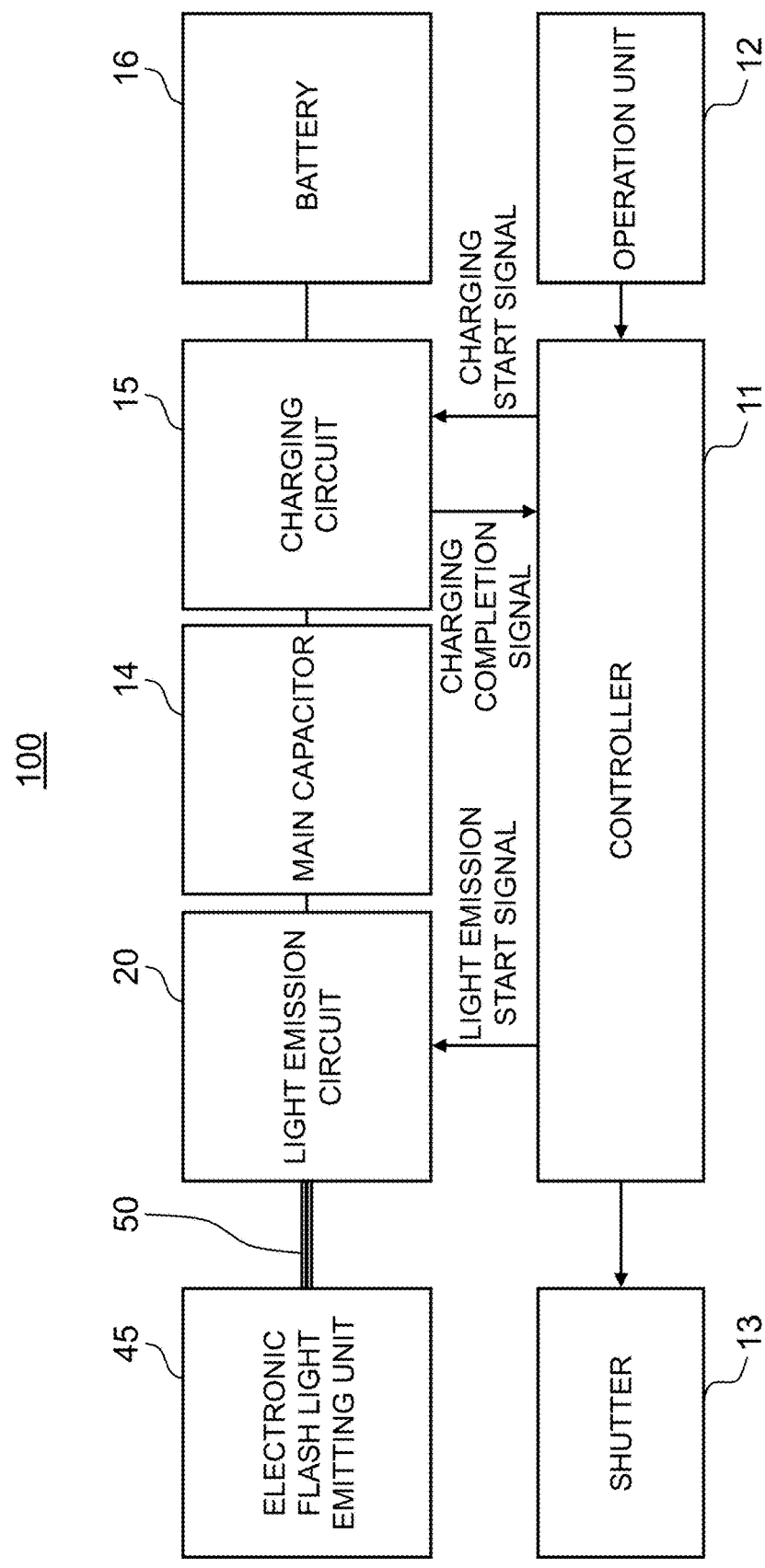
FIG. 2 is a block diagram regarding a configuration of the digital camera relating to electronic flash emission.

FIG. 2 is a block diagram showing a configuration relating to an electronic flash emission function in digital camera 100. As shown in FIG. 2, digital camera 100 includes controller 11 that controls an operation of digital camera 100, operation unit 12 that receives a user's operation, and shutter 13 for exposure.

Controller 11 integrally controls an entire operation of digital camera 100. Controller 11 may be achieved by a hard-wired electronic circuit, or a microcomputer that executes a program, for example. Controller 11 includes, for example, a central processing unit (CPU), a field-programmable gate array (FPGA), an application specific integrated circuit (ASIC), or a digital signal processor (DSP).

Operation unit 12 is a general term for a user interface such as an operation button and an operation dial disposed on an exterior of digital camera 100. Operation unit 12 receives an operation performed by a user. For example, operation unit 12 includes a release button, a power switch, and a mode dial which are provided to an upper face of digital camera 100. Operation unit 12 also includes a center button, a cross button, and a touch panel which are provided to a rear face of digital camera 100. When receiving the operation performed by the user, operation unit 12 transmits various operation instruction signals to controller 11.

Although not shown, digital camera 100 includes an optical system and an image sensor. The image sensor captures a subject image incident through the optical system and generates an image signal. The optical system includes a focus lens and a zoom lens. The image sensor is a charge coupled device (CCD) image sensor, or a complementary metal oxide semiconductor (CMOS) image sensor, for example.

Shutter 13 is an optical member that opens and closes to expose the image sensor.

Digital camera 100 also includes light emission circuit 20, main capacitor 14, charging circuit 15, and battery 16, as a configuration for driving electronic flash light emitting unit 45. Battery 16 is a rechargeable secondary battery. Charging circuit 15 is a circuit for charging battery 16. Main capacitor 14 is an element that charges power for driving electronic flash light emitting unit 45. Light emission circuit 20 causes electronic flash light emitting unit 45 to emit light under the control of controller 11. Electronic flash light emitting unit 45 and light emission circuit 20 are electrically connected to each other via flexible printed circuit (FPC) 50. Flexible printed circuit 50 has a flat shape. Flexible printed circuit 50 has flexibility. A wiring pattern is formed inside flexible printed circuit 50.

[1-2. Electronic Flash Light Emitting Unit]

Figure 3:
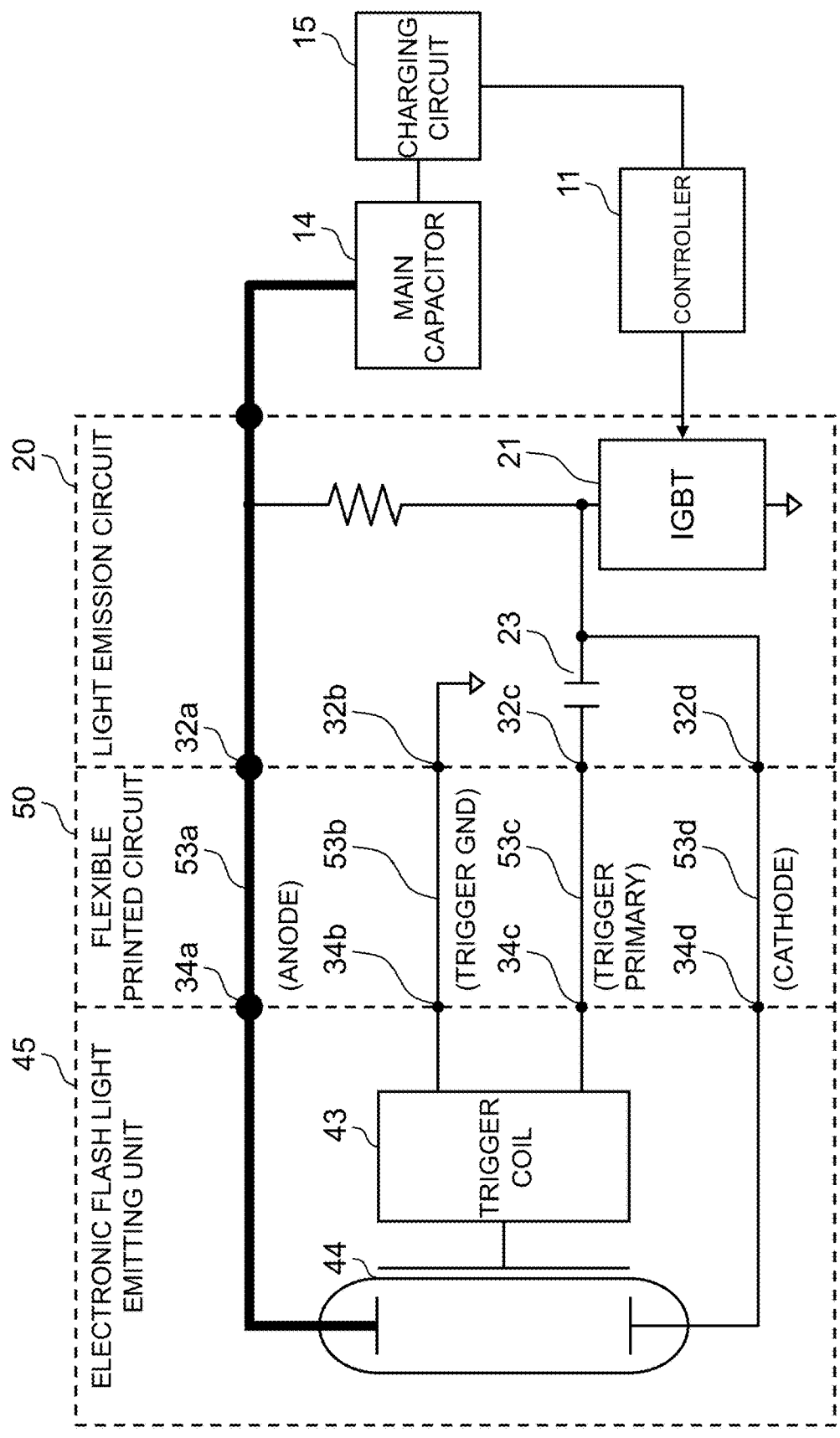
FIG. 3 is a circuit diagram of a circuit relating to driving of the electronic flash unit.

FIG. 3 is a circuit diagram showing components relating to a light emission operation of electronic flash light emitting unit 45. Light emission circuit 20 includes insulated gate bipolar transistor (IGBT) 21 and capacitor 23. Electronic flash light emitting unit 45 includes light emitting tube 44 that emits flashlight, and trigger coil 43 that generates a high voltage to be applied to light emitting tube 44. Light emitting tube 44 is a xenon tube, for example.

A trigger signal and power are supplied to electronic flash light emitting unit 45 from light emission circuit 20 via flexible printed circuit 50. The trigger signal is a signal for causing electronic flash light emitting unit 45 to start the light emission operation. The power to be transmitted is power for the light emission operation performed by electronic flash light emitting unit 45. To this end, light emission circuit 20 includes trigger primary terminal 32c and trigger GND terminal 32b for transmitting the trigger signal. Light emission circuit 20 also includes anode terminal 32a and cathode terminal 32d for transmitting power for driving electronic flash light emitting unit 45. Further, electronic flash light emitting unit 45 includes trigger primary terminal 34c and trigger GND terminal 34b for transmitting the trigger signal. Electronic flash light emitting unit 45 also includes anode terminal 34a and cathode terminal 34d for transmitting power for driving electronic flash light emitting unit 45. Flexible printed circuit 50 has wiring pattern 53c and wiring pattern 53b for transmitting the trigger signal. Flexible printed circuit 50 also has high-voltage wiring pattern 53a and wiring pattern 53d for transmitting power for driving electronic flash light emitting unit 45.

The light emission operation of electronic flash light emitting unit 45 will be described with reference to FIGS. 2 and 3. To drive electronic flash light emitting unit 45, controller 11 firstly transmits a charging start signal to charging circuit 15. When receiving the charging start signal, charging circuit 15 starts charging main capacitor 14. Main capacitor 14 is charged to 300 V, for example.

When finishing the charging of main capacitor 14, charging circuit 15 transmits a charging completion signal to controller 11. When receiving the charging completion signal, controller 11 recognizes that a state where the light emission operation can be performed is established. When the release button in operation unit 12 is pressed by the user, controller 11 closes shutter 13, and then, opens shutter 13 to start exposure.

Controller 11 transmits a light emission start signal to light emission circuit 20 at the same time as shutter 13 starts to open. Light emission circuit 20 causes light emitting tube 44 in electronic flash light emitting unit 45 to emit light in response to the light emission start signal.

More specifically, before light emission circuit 20 receives the light emission start signal from controller 11 with main capacitor 14 being charged to 300 V, capacitor 23 is also charged to 300 V, and the potential at a connection point between capacitor 23 and IGBT 21 is 300 V. When light emission circuit 20 receives the light emission start signal from controller 11, IGBT 21 is turned on. Thus, the connection point between capacitor 23 and IGBT 21 is connected to a ground. Accordingly, the potential at the connection point between capacitor 23 and IGBT 21 is changed to 0 V from 300 V, and a potential of trigger primary terminal 32c of light emission circuit 20 is changed to −300 V from 0 V. Therefore, a voltage of −300 V is applied to trigger primary terminal 34c. When the voltage of −300 V is applied to trigger primary terminal 34c, trigger coil 43 generates a voltage of 4 kV on the secondary side by a back electromotive force, and this voltage is applied to light emitting tube 44. When receiving the voltage of 4 kV, light emitting tube 44 emits light and generates flashlight.

[1-3. Flexible Printed Circuit]

Flexible printed circuit 50 that electrically connects electronic flash light emitting unit 45 and light emission circuit 20 to each other will be described.

Figure 4:
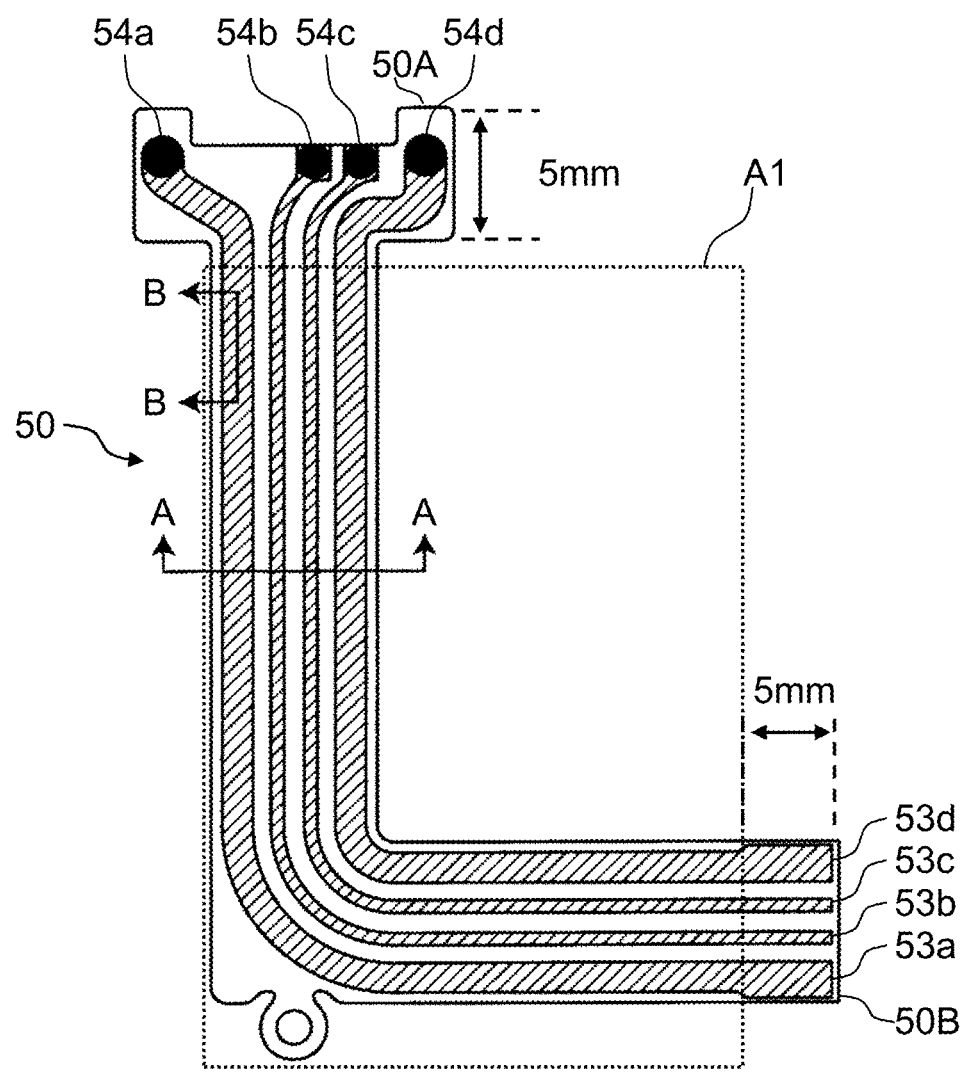
FIG. 4 is a view showing the flexible printed circuit that electrically connects the electronic flash unit and a light emission circuit to each other.

FIG. 4 is a plan view of flexible printed circuit 50. For easy understanding of wiring patterns, FIG. 4 does not show one (for example, second insulator 72 in FIG. 5A) of insulators of flexible printed circuit 50. As shown in FIG. 4, flexible printed circuit 50 includes terminals (electrodes) 54a, 54b, 54c, and 54d which are connected to anode terminal 34a, trigger GND terminal 34b, trigger primary terminal 34c, and cathode terminal 34d of electronic flash light emitting unit 45, respectively. High-voltage wiring pattern 53a and other wiring patterns 53b, 53c, and 53d are connected to terminals 54a, 54b, 54c, and 54d, respectively.

Figure 5A:
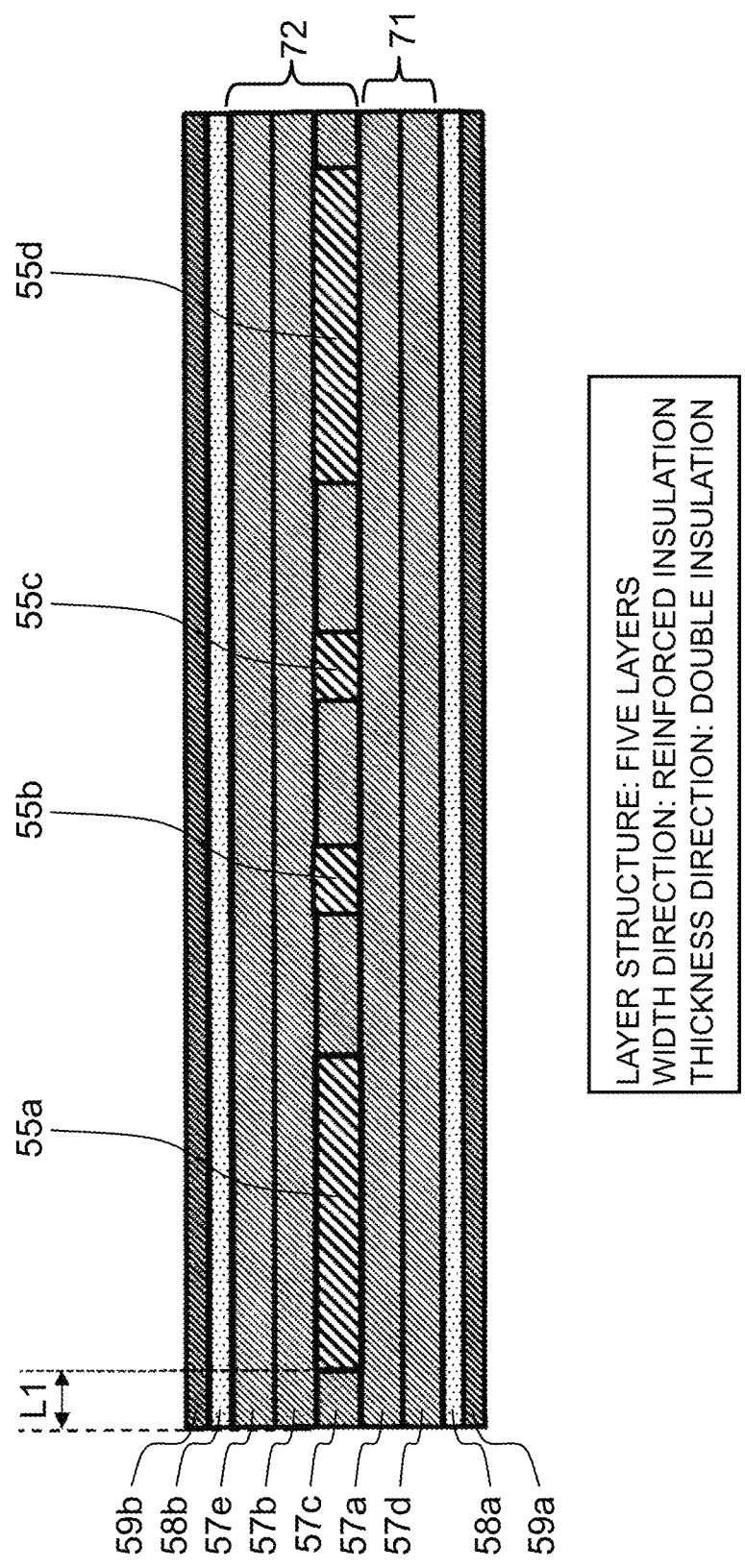
FIG. 5A is a sectional view of the flexible printed circuit (five-layer structure) shown in FIG. 4 taken along line A-A.
Figure 5B:
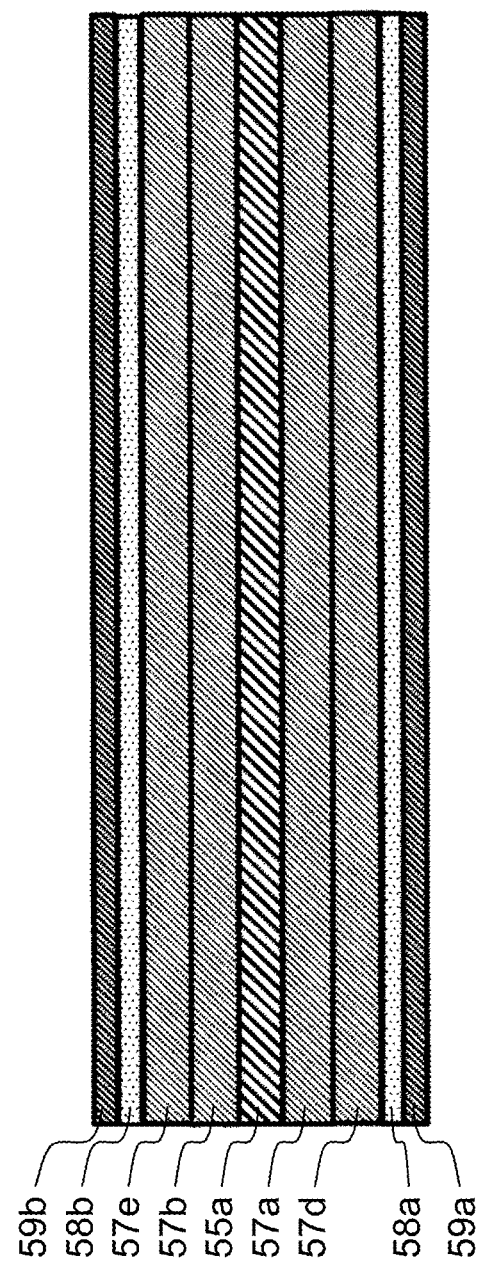
FIG. 5B is a sectional view of the flexible printed circuit (five-layer structure) shown in FIG. 4 taken along line B-B.

FIG. 5A is a sectional view of flexible printed circuit 50 shown in FIG. 4 taken along a width direction, that is, along line A-A. FIG. 5B is a sectional view of flexible printed circuit 50 shown in FIG. 4 taken along a longitudinal direction, that is, along line B-B. FIGS. 5A and 5B show the insulator which is not shown in FIG. 4.

As shown in these sectional views, flexible printed circuit 50 has a laminate structure. Specifically, flexible printed circuit 50 includes first resin layer 57a that is an insulating layer, and second resin layer 57b that is an insulating layer. Flexible printed circuit 50 also includes, between first resin layer 57a and second resin layer 57b, high-voltage wiring layer 55a, wiring layers 55b to 55d, and third resin layer 57c.

High-voltage wiring layer 55a and wiring layers 55b to 55d have electrical conductivity. High-voltage wiring layer 55a forms high-voltage wiring pattern 53a to which a high voltage (for example, 300 V) is applied. Wiring layers 55b to 55d form wiring patterns 53b to 53d, respectively. Third resin layer 57c is an insulating layer.

Moreover, protective first film layer 59a is disposed on a side of an opposite surface of first resin layer 57a from the surface where third resin layer 57c is disposed, with fourth resin layer 57d and first adhesive layer 58a being interposed between the opposite surface and protective first film layer 59a. Moreover, protective second film layer 59b is disposed on a side of an opposite surface of second resin layer 57b from the surface where third resin layer 57c is disposed, with fifth resin layer 57e and second adhesive layer 58b being interposed between the opposite surface and protective second film layer 59b.

First to fifth resin layers 57a to 57e and first and second film layers 59a and 59b are formed of a thermoplastic resin having insulating properties, for example, a liquid crystal polymer resin. As the thermoplastic resin, polyether ether ketone (PEEK), polyetherimide (PEI), polyphenylene sulfide (PPS), or polyimide (PI) may be used, for example. High-voltage wiring layer 55a and wiring layers 55b to 55d are formed of a conductive material, for example, copper.

Insulator 71 including first resin layer 57a and fourth resin layer 57d constitutes a first insulator in the present disclosure. Insulator 72 including third resin layer 57c, second resin layer 57b, and fifth resin layer 57e constitutes a second insulator in the present disclosure.

Insulators 71 and 72 are disposed in an area where insulation of high-voltage wiring layer 55a is required. The area where insulation is required is, for example, an area in a portion exposed to the outside in the second state (that is, in a pop-up state), in a case where flexible printed circuit 50 is used for arm unit 41 of electronic flash unit 40 in digital camera 100 shown in FIG. 1. The portion of arm unit 41 exposed to the outside may be touched by a user, and thus, needs to have high insulation.

In the present exemplary embodiment, the area where insulation of high-voltage wiring layer 55a is required is an area having a predetermined length between one end 50A and other end 50B in the longitudinal direction of flexible printed circuit 50 shown in FIG. 4.

More specifically, in the present exemplary embodiment, the area where insulation is required is area A1 between a portion distant from one end 50A of flexible printed circuit 50 by 5 mm or more and a portion distant from other end 50B by 5 mm or more. One end 50A and other end 50B are connected to a connector or the like, and therefore, they are not sealed by an insulator.

In the present exemplary embodiment, the portion having a length of about 5 mm from one end 50A of flexible printed circuit 50 is formed to be wider than the area where insulation is required. Further, high-voltage wiring pattern 53a in a portion having a length of about 5 mm from other end 50B of flexible printed circuit 50 is formed to be wider than high-voltage wiring pattern 53a in the area where insulation is required. According to the configuration where at least one of flexible printed circuit 50 itself and high-voltage wiring pattern 53a is formed to be wider near one end 50A and other end 50B of flexible printed circuit 50 as described above, flexible printed circuit 50 can be easily connected to a connector or the like. In the present exemplary embodiment, the portion near one end 50A and the portion near other end 50B are defined as a portion distant from one end 50A by about 5 mm and a portion distant from other end 50B by about 5 mm. However, at least one of flexible printed circuit 50 itself and high-voltage wiring pattern 53a may be formed to be wider in a portion within a specific area distant from one end 50A by at least 0 mm to 5 mm inclusive and in a portion within a specific area distant from other end 50B by at least 0 mm to 5 mm inclusive.

Figure 6:
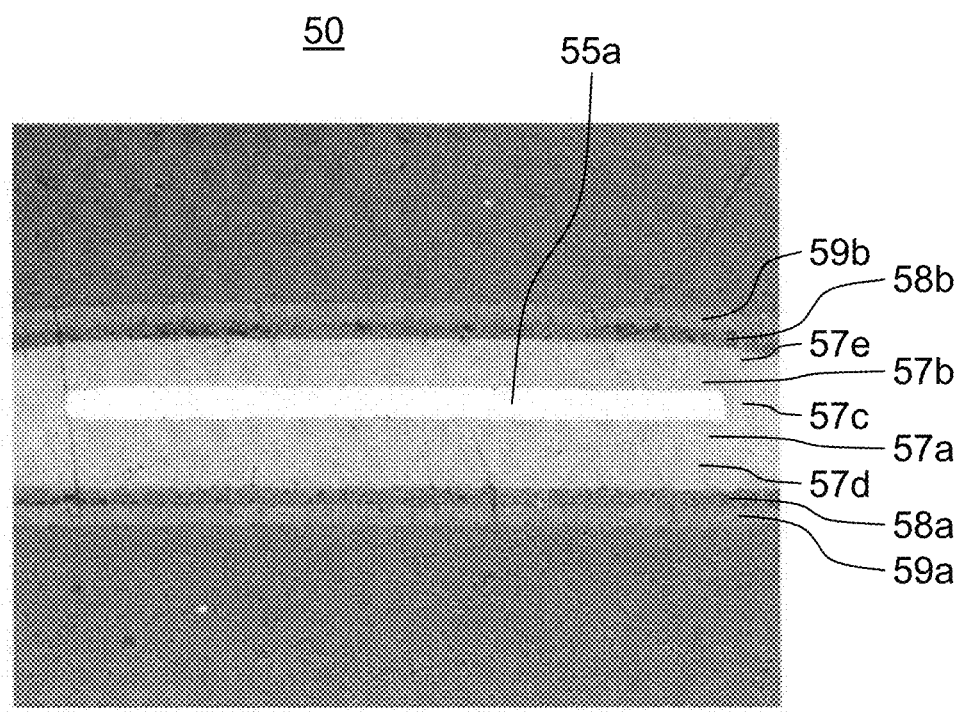
FIG. 6 is a view showing an image of a cross-section of the flexible printed circuit that electrically connects the electronic flash unit and the light emission circuit to each other.

Now, a method for manufacturing flexible printed circuit 50 will be described. First, a fourth resin base material for forming fourth resin layer 57*d* is prepared. A first resin base material for forming first resin layer 57*a* is disposed on the fourth resin base material. Copper foil for forming high-voltage wiring layer 55*a* and wiring layers 55*b* to 55*d* and a third resin base material for forming third resin layer 57*c* are disposed adjacent to one another on the first resin base material. A second resin base material for forming second resin layer 57*b* is further disposed on the copper foil and the third resin base material. A fifth resin base material for forming fifth resin layer 57*e* is disposed on the second resin base material. With this state, the first to fifth resin base materials are heat welded and joined to one another. In flexible printed circuit 50 formed by heat welding the resin base materials as described above, high-voltage wiring layer 55*a* is sealed by resin layers 57*a* to 57*e* (that is, insulating layers). FIG. 6 shows an image obtained by capturing a cross-section of an actual flexible printed circuit manufactured in the manner described above. It can be recognized from FIG. 6 that high-voltage wiring layer 55*a* is disposed in resin layers 57*a* to 57*e* (insulating layers) while being sealed. In the present exemplary embodiment, "sealing" means that, when the flexible printed circuit is observed with an electron microscope, the insulating layers enclosing high-voltage wiring layer 55*a* are in close contact with one another to such an extent that the interface between two adjacent insulating layers (for example, between first resin layer 57*a* and third resin layer 57*c*, between first resin layer 57*a* and fourth resin layer 57*d*, between third resin layer 57*c* and second resin layer 57*b*, and between second resin layer 57*b* and fifth resin layer 57*e*) cannot be seen, as shown in FIG. 6. For example, "sealing" indicates a state where two adjacent insulating layers are chemically joined.

High-voltage wiring layer 55*a* is a high-voltage portion to which a high voltage as high as 300 V is applied. IEC 60950 requires that any of the following insulations is provided to the high-voltage portion to which a high voltage as high as 300 V is applied.

Double insulation: insulation achieved by forming a double layer of an insulator having a withstand voltage of 3 kV or more.

Reinforced insulation: insulation using an insulator having a thickness of 0.4 mm or more and a withstand voltage of 3 kV or more.

Safety distance: if the above insulations cannot be achieved, a safety distance according to a voltage is required. For example, in the case of a voltage of 300 V, a clearance distance of 3.2 mm and a creepage distance of 6 mm are required from the high-voltage portion.

Note that FIG. 15 is a diagram showing an abstract of excerpts from IEC 60950 which is an IEC standard. If the applied voltage is 300 V, the column of "working voltage: over 210 V and not more than 420 V" in the table in FIG. 15 is referred to regarding the reinforced insulation.

From the above, in flexible printed circuit 50, resin layers 57*a*, 57*b*, 57*c*, 57*d*, and 57*e*, that is, the insulating layers, disposed around high-voltage wiring layer 55*a* are required to be disposed to meet the requirements of IEC 60950. Specifically, in the present exemplary embodiment, resin layers 57*a*, 57*b*, 57*c*, 57*d*, and 57*e* all have a withstand voltage of 3 kV or more. Further, the reinforced insulation defined by IEC 60950 can be achieved in the width direction by setting distance L1 from outermost wiring layer 55*a* to the end face of flexible printed circuit 50 to be 0.4 mm or more. On the other hand, at the lower part in the thickness direction, resin layer 57*a* and resin layer 57*d* are disposed below high-voltage wiring layer 55*a*, whereby the double insulation defined by IEC 60950 can be achieved. At the upper part in the thickness direction, resin layer 57*b* and resin layer 57*e* are disposed above high-voltage wiring layer 55*a*, whereby the double insulation defined by IEC 60950 can be achieved. Thus, flexible printed circuit 50 meets the insulation requirements defined by IEC 60950 in the width direction and in the thickness direction. Further, reduction in a thickness of flexible printed circuit 50 can be achieved.

Figure 7:
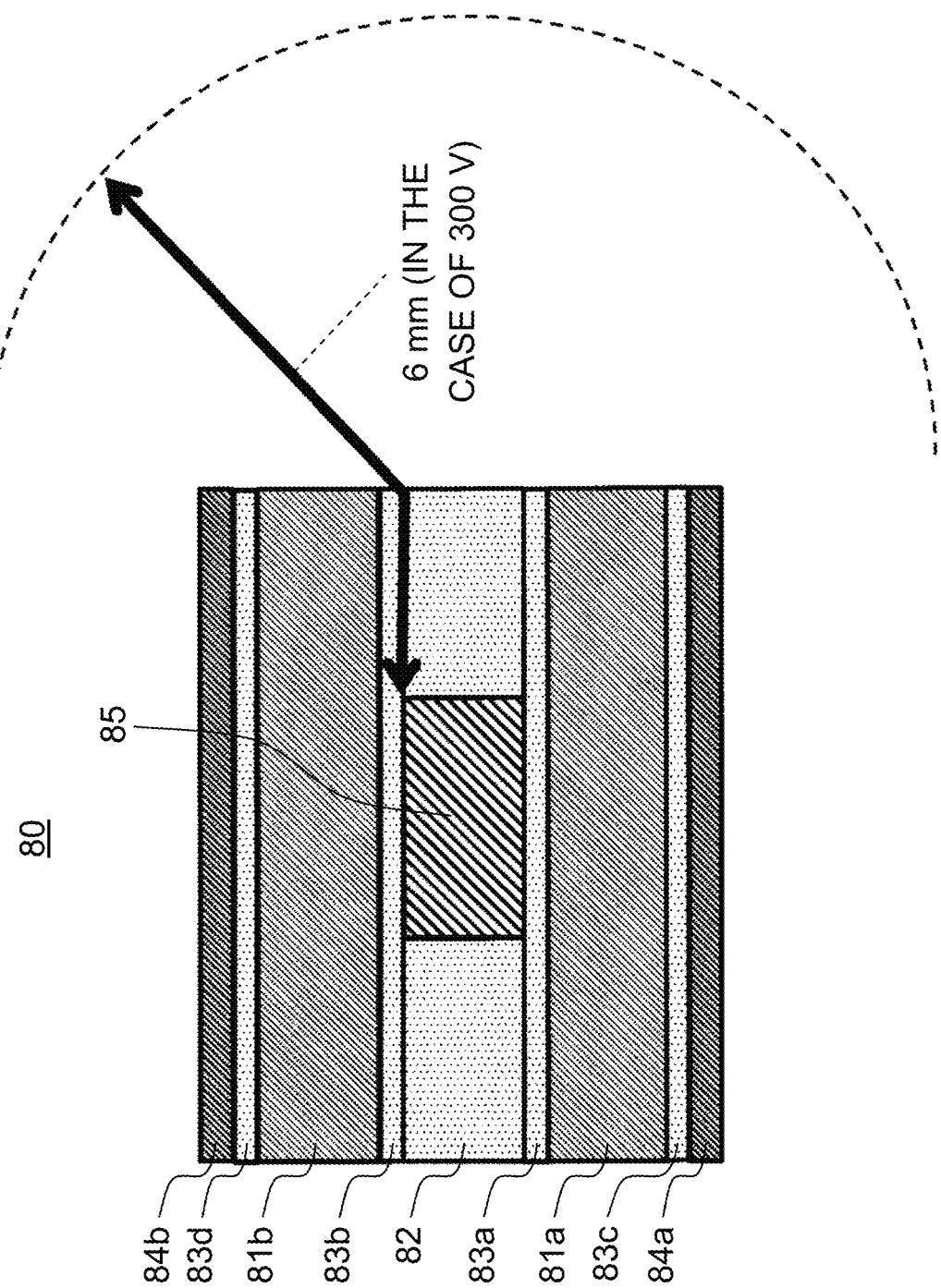
FIG. 7 is a view for describing a problem of a conventional flexible printed circuit.

FIG. 7 is a view showing a configuration of a conventional flexible printed circuit in which, different from flexible printed circuit 50 in the present exemplary embodiment, resin layers are joined with an adhesive agent. Conventional flexible printed circuit 80 shown in FIG. 7 includes first resin layer 81*a* and second resin layer 81*b* which are insulating layers. Flexible printed circuit 80 includes adhesive layer 82 including an adhesive agent and high-voltage wiring layer 85 which are disposed between first resin layer 81*a* and second resin layer 81*b*. Further, adhesive layers 83*a* and 83*b* are disposed between first resin layer 81*a* and adhesive layer 82 and between second resin layer 81*b* and adhesive layer 82, respectively. In addition, first resin layer 81*a* is joined to film layer 84*a* with adhesive layer 83*c* interposed therebetween. Second resin layer 81*b* is joined to film layer 84*b* with adhesive layer 83*d* interposed therebetween.

Adhesive layers 82 and 83*a* to 83*d* are not an insulator. Accordingly, wiring layer 85 serving as a high-voltage portion is electrically exposed from the insulators (resin layers 81*a* and 81*b*) via adhesive layers 82, 83*a*, and 83*b*. Therefore, according to the definition of IEC 60950, it is necessary to ensure a specified safety distance from high-voltage wiring layer 85 serving as the high-voltage portion, as shown in FIG. 7. For example, if a voltage of 300 V is applied to high-voltage wiring layer 85, it is necessary to ensure 6 mm as a safety distance. To this end, an insulation tape is conventionally wound around flexible printed circuit 80 to ensure the safety distance.

On the other hand, in flexible printed circuit 50 in the present exemplary embodiment, resin layers 57*a* to 57*e* are heat welded and joined to one another as described above. That is, two adjacent resin layers in resin layers 57*a* to 57*e* are joined to each other by heat welding. Therefore, high-voltage wiring layer 55*a* is enclosed and sealed by the insulators formed of resin layers 57*a* to 57*e* as shown in FIG. 5A. Thus, resin layers 57*a* to 57*e*, that is, the insulators, are formed to meet the double insulation or reinforced insulation defined by IEC 60950, which eliminates the need to additionally provide a configuration for ensuring insulation. That is to say, flexible printed circuit 50 does not need an insulation tape being wound around flexible printed circuit 50 to comply with the requirements of IEC 60950 regarding insulation.

Figure 8:
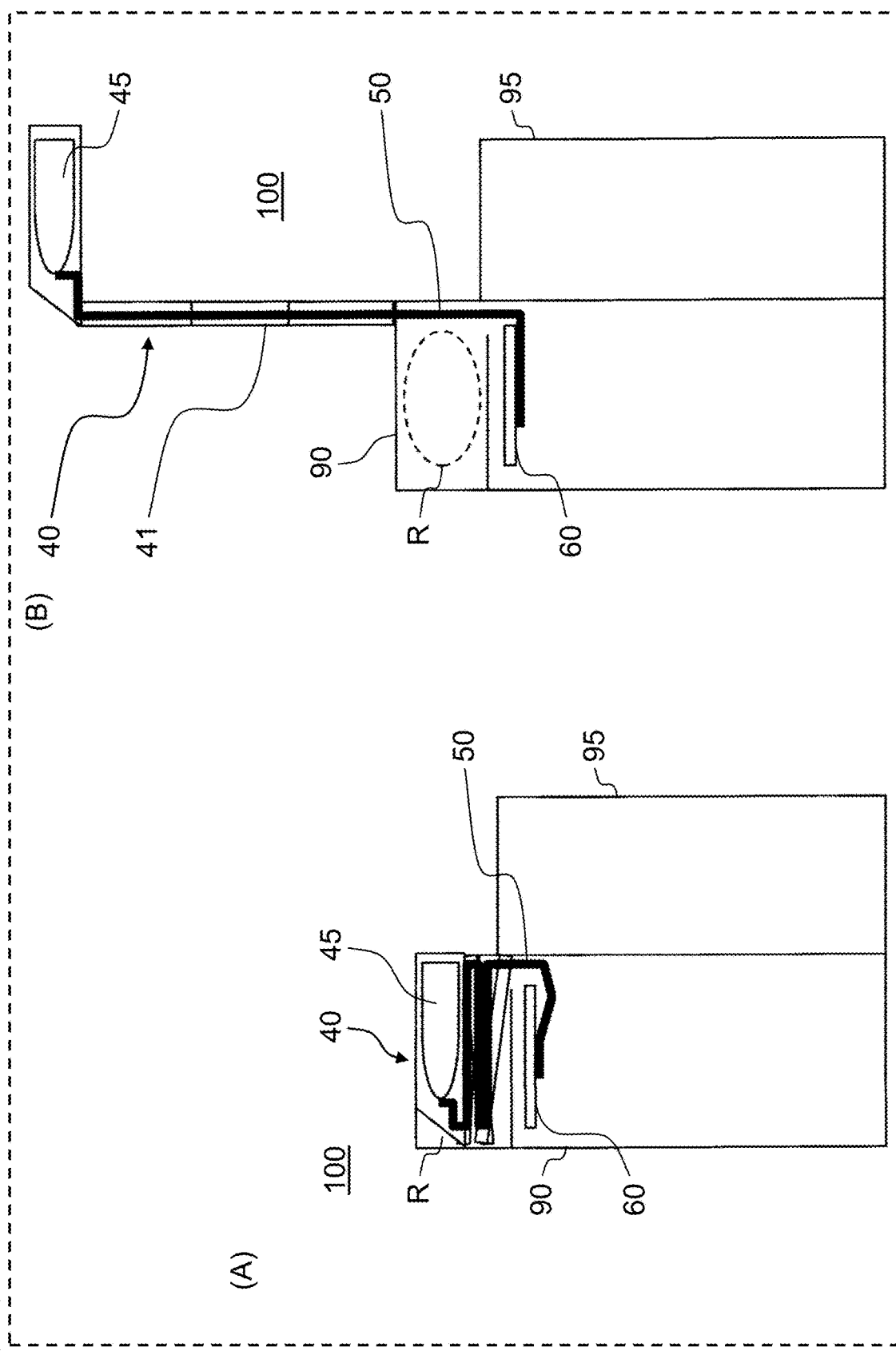
FIG. 8 is a schematic view, wherein part (A) shows a storage state of the flexible printed circuit in the digital camera when the electronic flash unit is stored, and part (B) shows a state of the flexible printed circuit in the digital camera when the electronic flash unit pops up from a camera body.

FIG. 8 is a view for describing a state of flexible printed circuit 50 stored in camera body 90 or in electronic flash unit 40. Part (A) of FIG. 8 is a view for schematically showing a storage state of flexible printed circuit 50 when electronic flash unit 40 is stored. Part (B) of FIG. 8 is a view schematically showing a state of flexible printed circuit 50 when electronic flash unit 40 pops up from camera body 90.

As shown in part (A) of FIG. 8, electronic flash unit 40 is stored in storage space R formed in an upper part of camera body 90. At that time, flexible printed circuit 50 is also stored in storage space R in a folded state in zigzag. On the other hand, as shown in part (B) of FIG. 8, when electronic flash unit 40 pops up from camera body 90, flexible printed circuit 50 projects from camera body 90 and extends along arm unit 41 of electronic flash unit 40. In FIG. 8, substrate 60 is a circuit board on which light emission circuit 20 is mounted.

A problem will be described below which is assumed when conventional flexible printed circuit 80 around which an insulation tape is wound for electrical connection between an electronic flash light emitting unit and a light emission circuit is used in a digital camera including a pop-up electronic flash unit as described above.

Figure 9:
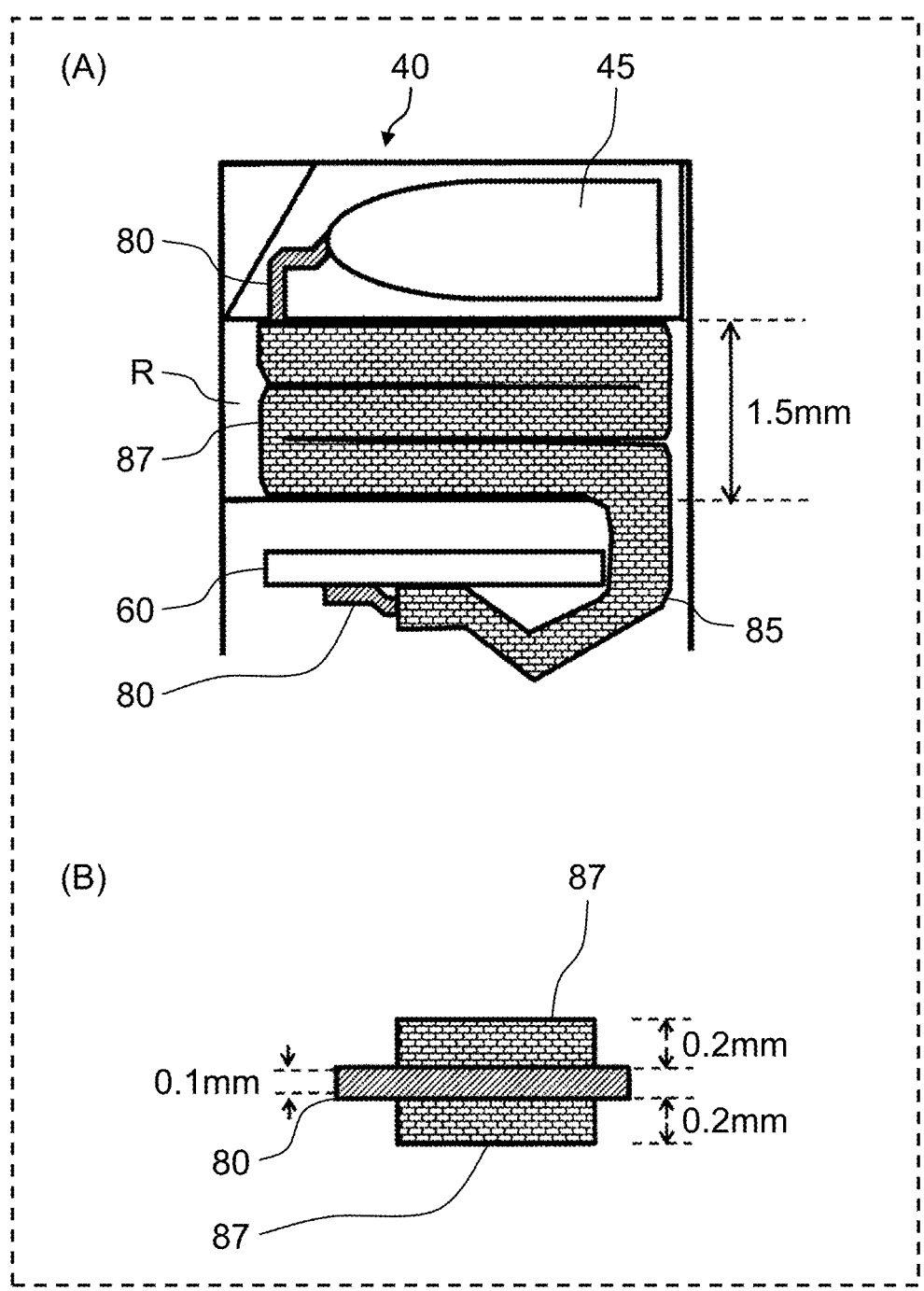
FIG. 9 is an explanatory view, wherein part (A) is a view for describing a storage state of a flexible printed circuit, around which an insulation tape is wound, in the digital camera, and part (B) is a view for describing thicknesses of the insulation tape and the flexible printed circuit.
Figure 10:
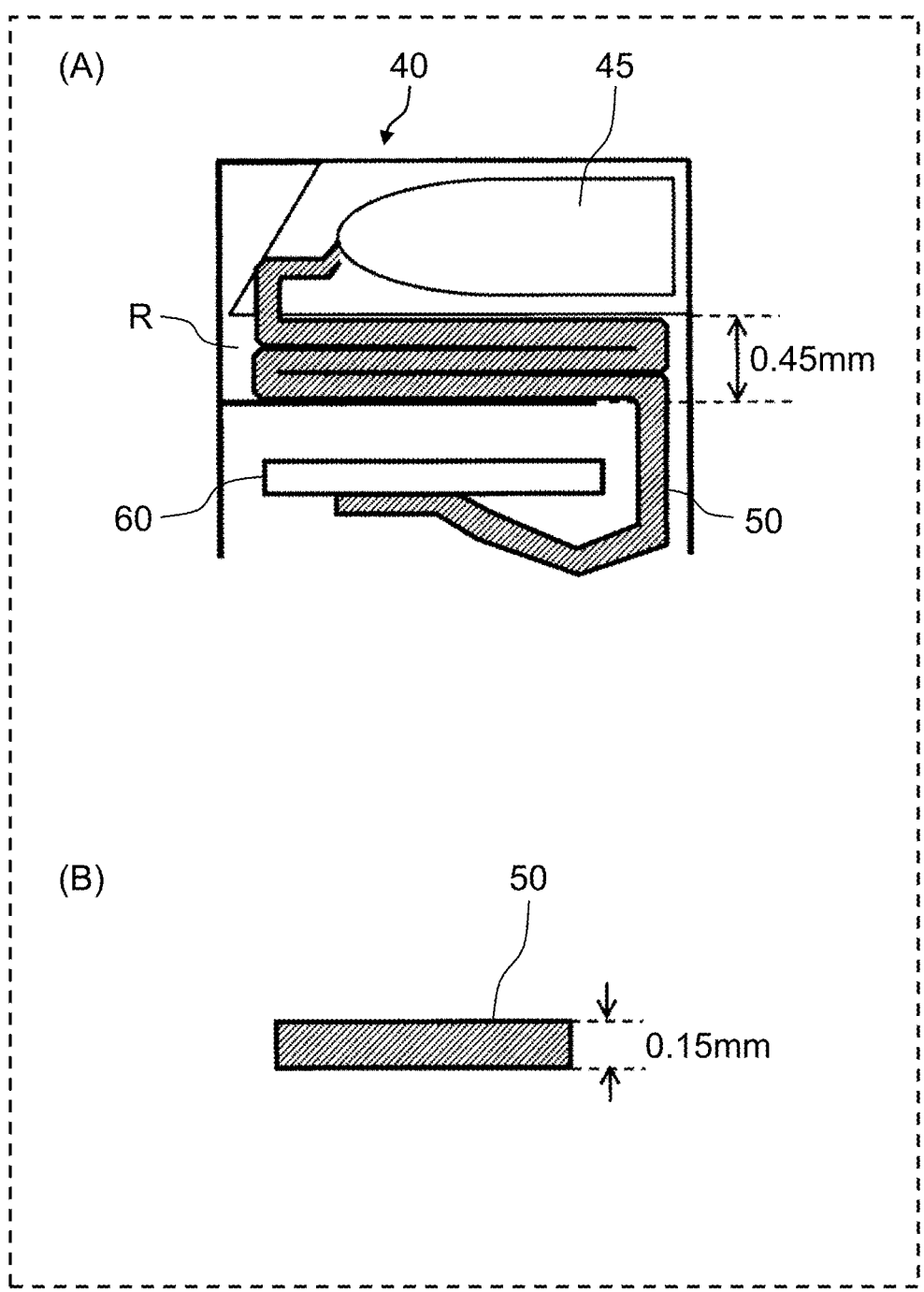
FIG. 10 is an explanatory view, wherein part (A) is a view for describing the storage state of the flexible printed circuit in the digital camera according to the present disclosure, and part (B) is a view for describing a thickness of the flexible printed circuit.

Part (A) of FIG. 9 is a view showing a storage state of conventional flexible printed circuit 80, around which insulation tape 87 is wound, in storage space R of the digital camera. Part (B) of FIG. 9 is a view showing thicknesses of insulation tape 87 and flexible printed circuit 80. Part (A) of FIG. 10 is a view showing a storage state of flexible printed circuit 50 in storage space R of digital camera 100 according to the present exemplary embodiment. Part (B) of FIG. 10 is a view showing a thickness of flexible printed circuit 50.

Conventional flexible printed circuit 80 around which the insulation tape is wound increases in thickness. Therefore, when flexible printed circuit 80 is folded and stored in storage space R in the camera body, the size of space R for storing flexible printed circuit 80 is increased by an amount corresponding to the thickness of folded insulation tape 87, as shown in part (A) of FIG. 9. For example, according to the experiment conducted by the inventor of the present disclosure, 1.5 mm is required as a height of a space for storing flexible printed circuit 80 when the thickness of flexible printed circuit 80 is 0.1 mm and the thickness of insulation tape 87 is 0.2 mm.

On the other hand, flexible printed circuit 50 according to the present exemplary embodiment does not need to have an insulation tape being wound around flexible printed circuit 50, and thus, as shown in part (A) of FIG. 10, when flexible printed circuit 50 is folded and stored in the camera body, the size of space R for storing flexible printed circuit 50 can be made smaller as compared to the configuration shown in part (A) of FIG. 9. For example, when the thickness of flexible printed circuit 50 is 0.15 mm, 0.45 mm is sufficient for a height of the space for storing flexible printed circuit 80. Thus, according to flexible printed circuit 50 in the present exemplary embodiment, digital camera 100 can be downsized.

As described above, in flexible printed circuit 50 described in the present exemplary embodiment, resin layers 57a to 57e (insulating layers) enclosing high-voltage wiring layer 55a are joined to one another by heat welding. Thus, high insulation can be ensured by flexible printed circuit 50 alone without using an insulation tape.

Figure 11:
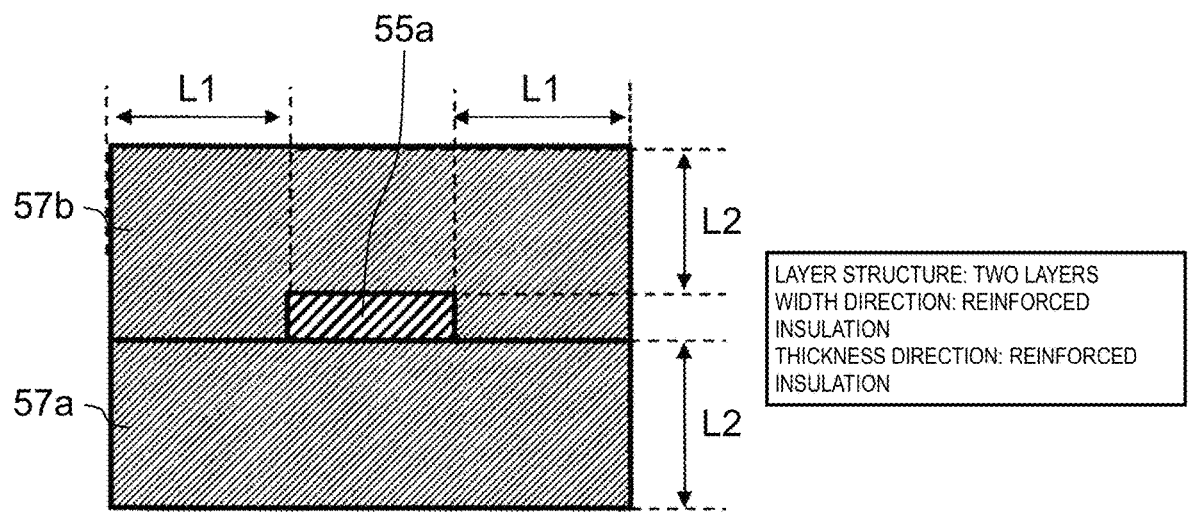
FIG. 11 is a view for describing a variation (two-layer structure) of a layer structure of the flexible printed circuit.
Figure 12:
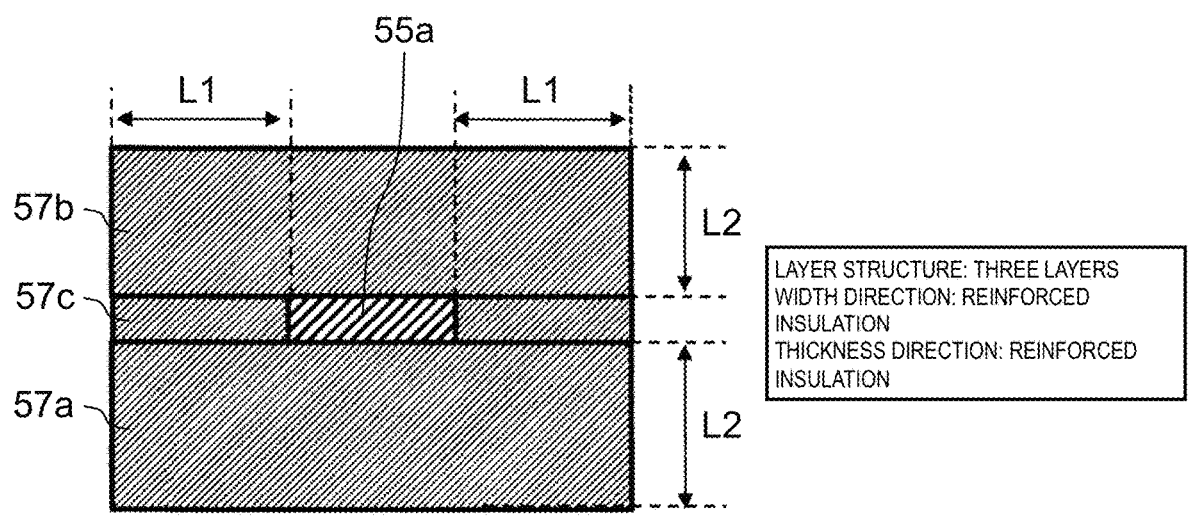
FIG. 12 is a view for describing a variation (three-layer structure) of a layer structure of the flexible printed circuit.
Figure 13:
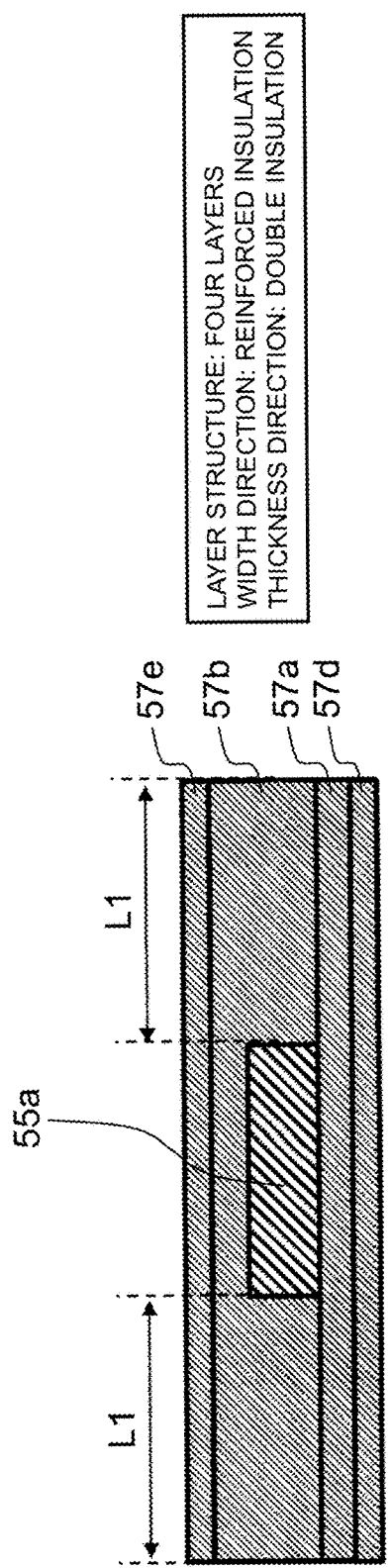
FIG. 13 is a view for describing a variation (four-layer structure) of a layer structure of the flexible printed circuit.

In the above description, the flexible printed circuit has a layer structure including five resin layers. However, the number of the resin layers (insulating layers) is not limited to five. FIGS. 11 to 13 show other examples of the layer structure of the flexible printed circuit. FIGS. 11 to 13 each show a sectional view of a flexible printed circuit taken along a width direction, wherein the flexible printed circuit has only one wiring layer formed along a longitudinal direction for convenience of description. In FIGS. 11 to 13, adhesive layers and film layers are not shown for convenience of description. In FIGS. 11 to 13, it is supposed that a high voltage of 300 V, for example, is applied to high-voltage wiring layer 55a as in the first exemplary embodiment.

FIG. 11 shows an example where the flexible printed circuit includes two resin layers 57a and 57b. In this case, resin layers 57a and 57b may be formed of resin having a withstand voltage of 3 kV or more and L1 and L2 may be set to be 0.4 mm or more to achieve reinforced insulation in the width direction and in the thickness direction. Note that, in the configuration shown in FIG. 11, first resin layer 57a constitutes the first insulator in the present disclosure. Second resin layer 57b constitutes the second insulator in the present disclosure.

FIG. 12 shows an example where the flexible printed circuit includes three resin layers 57a, 57b, and 57c. In the example shown in FIG. 12, high-voltage wiring layer 55a and third resin layer 57c are formed between first resin layer 57a and second resin layer 57b. In this case, to achieve reinforced insulation in the width direction and in the thickness direction, first, second, and third resin layers 57a, 57b, and 57c may be formed of resin having a withstand voltage of 3 kV or more and L1 and L2 may be set to be 0.4 mm or more. Note that, in the configuration shown in FIG. 12, first resin layer 57a constitutes the first insulator in the present disclosure. Second resin layer 57b and third resin layer 57c constitute the second insulator in the present disclosure.

FIG. 13 shows an example where the flexible printed circuit includes four resin layers 57a, 57b, 57d, and 57e. In the example shown in FIG. 13, fourth resin layer 57d is formed on an opposite surface of first resin layer 57a from the surface in contact with high-voltage wiring layer 55a. In addition, fifth resin layer 57e is formed on an opposite surface of second resin layer 57b including high-voltage wiring layer 55a from the surface in contact with first resin layer 57a. In this case, L1 may be set to be 0.4 mm or more and the resin layers (insulating layers) 57a, 57b, 57d, and 57e may be formed of resin having a withstand voltage of 3 kV or more to achieve reinforced insulation in the width direction and double insulation in the thickness direction. Note that, in the configuration shown in FIG. 13, first resin layer 57a and fourth resin layer 57d constitute the first insulator in the present disclosure. Second resin layer 57b and fifth resin layer 57e constitute the second insulator in the present disclosure.

Figure 14:
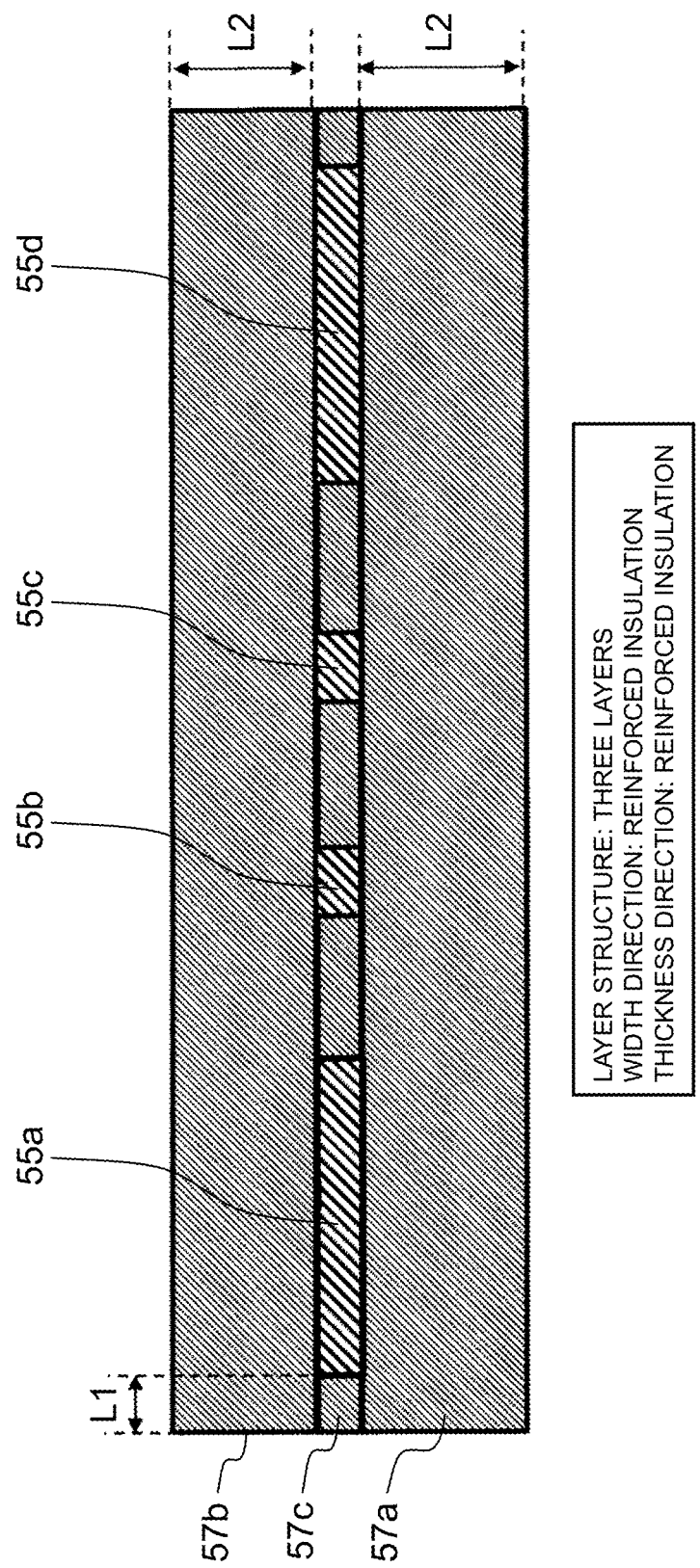
FIG. 14 is a view for describing a variation (three-layer structure) of a layer structure of the flexible printed circuit.

FIGS. 11 to 13 show the configuration of the flexible printed circuit in which only one high-voltage wiring layer is formed along the longitudinal direction for convenience of description. However, it is obvious that the concept of FIGS. 11 to 13 is also applicable to another configuration including a plurality of wiring layers. For example, as shown in FIG. 14, the configuration, shown in FIG. 12, which includes three resin layers 57a, 57b, and 57c and to which reinforced insulation is applied in the width direction and in the thickness direction is applicable to a configuration including a plurality of wiring layers 55b to 55d in addition to high-voltage wiring layer 55a as shown in FIG. 5A. In this case, the flexible printed circuit may also be formed such that first and second resin layers 57a and 57b are formed of resin having a withstand voltage of 3 kV or more and L1 and L2 are set to be 0.4 mm or more to achieve reinforced insulation in the width direction and in the thickness direction.

[1-4. Effects and Other Related Features]

As described above, flexible printed circuit 50 according to the present exemplary embodiment includes: first insulator 71 formed of resin and including first resin layer 57a (an example of a first insulating layer); second insulator 72 formed of resin and including second resin layer 57b (an example of a second insulating layer); and high-voltage wiring layer 55a disposed between first resin layer 57a and second resin layer 57b and formed of a conductive material. Each of first insulator 71 and second insulator 72 meets IEC 60950 that is an IEC standard. An area where insulation of high-voltage wiring layer 55a is required is sealed by first insulator 71 and second insulator 72 (see FIGS. 5A and 11 to 13). Flexible printed circuit 50 may further include (at least one of) wiring layers 55b to 55d disposed between first resin layer 57a and second resin layer 57b.

In this way, high-voltage wiring layer 55a is sealed by the insulators including first resin layer 57a and second resin layer 57b. Thus, when the resin layers constituting the insulators enclosing at least high-voltage wiring layer 55a are formed to meet double insulation or reinforced insulation defined by IEC 60950, it becomes unnecessary to additionally provide a configuration for ensuring insulation. That is, it becomes unnecessary to wind an insulation tape around flexible printed circuit 50, and therefore, a flexible printed circuit that can ensure high insulation with reduced thickness can be achieved. It is to be noted that wiring layers 55b to 55d other than high-voltage wiring layer 55a may be sealed by first insulator 71 and second insulator 72. However, if a high-voltage is not applied to these wiring layers, it is not always necessary to meet the requirement of IEC 60950.

In the flexible printed circuit, third resin layer 57c (an example of a third insulating layer) may be disposed between first resin layer 57a and second resin layer 57b so as to be arranged side by side high-voltage wiring layer 55a and wiring layers 55b to 55d (see FIG. 5A).

In addition, as shown in FIG. 13, in the flexible printed circuit, first insulator 71 may include fourth resin layer 57d (an example of a fourth insulating layer) formed on an opposite surface of first resin layer 57a from a surface in contact with high-voltage wiring layer 55a and wiring layers 55b to 55d. In addition, second insulator 72 may include fifth resin layer 57e (an example of a fifth insulating layer) formed on an opposite surface of second resin layer 57b from a surface in contact with high-voltage wiring layer 55a.

First resin layer 57a and second resin layer 57b may be formed of an insulating material having a withstand voltage of 3 kV or more. With this configuration, it is possible to meet the requirements regarding insulation defined by IEC 60950.

Further, the adjacent insulating layers may be joined to each other by heat welding. According to this configuration, high-voltage wiring layer 55a and wiring layers 55b to 55d are sealed by the insulators including first resin layer 57a and second resin layer 57b.

A voltage to be applied to high-voltage wiring layer 55a may exceed 300 V. In this case, it is preferable that first insulator 71 and second insulator 72 are configured to meet the withstand voltage defined by IEC 60950.

The area where insulation of high-voltage wiring layer 55a is required is a portion having a predetermined length between one end 50A and other end 50B of flexible printed circuit 50 in the longitudinal direction. More specifically, the area where insulation is required is a third area obtained by excluding a first area and a second area from the entire area of flexible printed circuit 50. The first area includes a predetermined area distant from one end 50A by at least 0 mm to 5 mm inclusive. The second area includes a predetermined area distant from other end 50B by at least 0 mm to 5 mm inclusive. Portions near one end 50A and other end 50B may not be required to have insulation, because these portions are connected to a connector or the like. In an area excluding the portions connected to a connector or the like, high-voltage wiring layer 55a may be sealed by first insulator 71 and second insulator 72.

Further, high-voltage wiring layer 55a may be wirings for transmitting a voltage of 200 V or more, respectively. In the present exemplary embodiment, when flexible printed circuit 50 includes a wiring layer which is a high-voltage portion described above, high insulation can be achieved.

Digital camera 100 (an example of an imaging apparatus) according to the present exemplary embodiment includes: camera body 90; electronic flash unit 40 configured to assume one of a state of being popped up from the camera body and a state of being stored in camera body 90 and to emit flashlight; light emission circuit 20 that is stored in camera body 90 and configured to supply a power source to electronic flash unit 40; and flexible printed circuit 50 that electrically connects electronic flash unit 40 and light emission circuit 20 to each other. Due to the configuration described above where electronic flash unit 40 that can pop up from camera body 90 is connected to light emission circuit 20 using flexible printed circuit 50 according to the present exemplary embodiment, digital camera 100 can be downsized.

Other Exemplary Embodiments

The first exemplary embodiment has been described above as an example of the technique disclosed in the present application. However, the technique of the present disclosure is not limited to the first exemplary embodiment, but is applicable to other exemplary embodiments including appropriate modifications, substitutions, additions, and omissions. In addition, new exemplary embodiments can be made by combining constituent elements described in the first exemplary embodiment. Hence, other exemplary embodiments will be described below.

Although a voltage of 300 V is applied to the high-voltage portion in the above exemplary embodiment, a value of a voltage to be applied is not limited thereto. First insulator 71 and second insulator 72 may only be configured to meet IEC 60950 according to the voltage to be applied. Specifically, first insulator 71 and second insulator 72 may only meet at least any one of reinforced insulation, double insulation, and safety distance defined by IEC 60950.

For example, referring to FIG. 15, it is found that, in the case of a voltage to be applied of 210 V or less, a required withstand voltage for reinforced insulation is 2 kV or more. That is, to meet IEC 60950, any one of the following requirements may be satisfied with respect to the high-voltage portion to which a high voltage of 210 V or less is applied.

Double insulation: insulation achieved by forming a double layer of an insulator having a withstand voltage of 2 kV or more.

Reinforced insulation: insulation using an insulator having a thickness of 0.4 mm or more and a withstand voltage of 2 kV or more.

Safety distance: if the above insulations cannot be achieved, a safety distance according to a voltage is required. For example, in the case of a voltage of 200 V, a clearance distance of 3.2 mm and a creepage distance of 4 mm are required from the high-voltage portion.

Although respective resin layers 57a to 57e are formed of a same kind of thermoplastic resin in the above exemplary embodiment, resin layers 57a to 57e may be formed of different kinds of thermoplastic resins. However, it is more preferable that respective resin layers 57a to 57e are formed of the same kind of thermoplastic resin, because, in this case, these resin layers are hardly peeled off from one another.

In the above exemplary embodiment, a digital camera is described as a device to which the flexible printed circuit in the present disclosure is applied. However, it is obvious that the flexible printed circuit in the present disclosure is applicable to various electronic devices (for example, video cameras and personal computers) besides digital cameras.

The above exemplary embodiment shows some materials for the insulating layers and wiring layers. However, the materials of the insulating layers and wiring layers are not limited to those described in the above exemplary embodiment.

In the above exemplary embodiment, the wiring layers are sealed by the insulating layers by joining the insulating layers formed of resin materials to one another by heat welding. The method for joining the insulating layers is not limited to heat welding, and any other methods may be applied to join the insulating layers as long as the wiring layers can be sealed by the insulating layers.

The exemplary embodiment has been described herein as an example of the technique in the present disclosure. For this purpose, the accompanying drawings and the detailed description have been provided.

Therefore, the components described in the attached drawings and the detailed description include not only the components essential for solving the problem but also components that are not essential for solving the problem in order to illustrate the technique. It should not be therefore determined that the unessential constituents in the accompanying drawings and the detailed description are essential only based on the fact that these constituents are included in the drawings and the description.

The above exemplary embodiment is provided to exemplify the technique according to the present disclosure, and thus various changes, replacements, additions, omissions, and the like can be made within the scope of the claims and equivalents thereof.

The flexible printed circuit in the present disclosure achieves a reduction in thickness while having high insulation, and therefore, is useful for various electronic devices (digital cameras, video cameras, personal computers, and the like).

What is claimed is:

1. An imaging apparatus comprising:
a main body;
an electronic flash unit that is attached to the main body and requires high voltage where safe distance is required;
a circuit that is stored in the main body and configured to supply an electric power to drive the electronic flash unit; and
a flexible printed circuit configured to electrically connect the electronic flash unit and the circuit to each other,
wherein the flexible printed circuit includes:
a first insulator formed of resin and including a first insulating layer;
a second insulator formed of resin and including a second insulating layer; and
a wiring layer disposed between the first insulating layer and the second insulating layer and formed of a conductive material, the wiring layer to which the high voltage is applied and transmits the electric power to the electronic flash unit,
wherein the flexible printed circuit has a length which is greater than a width and thickness of the flexible printed circuit, the width and the thickness of the flexible printed circuit board being perpendicular to the length,
the flexible printed circuit includes a sealed structure in which the wiring layer is enclosed by flexible insulators formed of resin including the first insulator and the second insulator, in a region where insulation of the wiring layer is required, in a cross-section of the region taken along the width direction and the thickness direction of the flexible printed circuit,
each of the insulators enclosing the wiring layer meets double insulation or reinforced insulation defined by International Electrotechnical Commission (IEC) 60950, which is an IEC standard, for insulating the wiring layer, so as to meet the IEC standard in both the width direction and the thickness direction, and
the sealed structure having the cross-section extends by a predetermined length along a longitudinal direction of the flexible printed circuit.

2. The imaging apparatus according to claim 1, wherein, when each of the first insulator and the second insulator meets the reinforced insulation, a third insulating layer included in the insulators is disposed between the first insulating layer and the second insulating layer so as to be arranged side by side horizontally with the wiring layer.

3. The imaging apparatus according to claim 1, wherein, when each of the first insulator and the second insulator meets the double insulation,
the first insulator includes a fourth insulating layer disposed on an opposite surface of the first insulating layer from a surface in contact with the wiring layer, and
the second insulator includes a fifth insulating layer disposed on an opposite surface of the second insulating layer from a surface in contact with the wiring layer.

4. The imaging apparatus according to claim 1, wherein the first insulating layer and the second insulating layer are formed of an insulating material having a withstand voltage of 3 kV or more.

5. The imaging apparatus according to claim 1, wherein two adjacent insulating layers in a plurality of insulating layers included in the first insulator and the second insulator are formed of a thermoplastic resin having insulating properties and are joined to each other by heat welding, the plurality of insulating layers including the first insulating layer and the second insulating layer.

6. The imaging apparatus according to claim 1, wherein the wiring layer is a wiring for transmitting a voltage of 200 V or more.

7. The imaging apparatus according to claim 1, wherein the region is disposed in a portion having a predetermined length between longitudinal ends of the flexible printed circuit.

8. The imaging apparatus according to claim 7, wherein the portion having the predetermined length is a third area obtained by excluding a first area and a second area from an entire area of the flexible printed circuit,
the first area includes a predetermined area distant from one of the longitudinal ends of the flexible printed circuit by at least 0 mm to 5 mm inclusive, and
the second area includes a predetermined area distant from another of the longitudinal ends of the flexible printed circuit by at least 0 mm to 5 mm inclusive.

9. The imaging apparatus according to claim 1, wherein in the cross-section the insulators enclosing the wiring layer directly contact the wiring layer along an entire perimeter of the wiring layer.

10. The imaging apparatus according to claim 1, wherein the flexible printed circuit is stored in the main body when the electronic flash unit is stored in the main body.

11. The imaging apparatus according to claim 1, wherein the flexible printed circuit does not require insulation tape wound therearound to ensure insulation properties complying with the IEC 60950 standard.

12. The imaging apparatus according to claim 1, wherein the electronic flash unit is movable between a stored position in the main body and a popped up position extended from the main body, and when the electronic flash unit is stored in the main body the flexible printed circuit is stored in the main body in a folded zigzag state.

13. The imaging apparatus according to claim 12, wherein the flexible printed circuit does not include insulation tape wound therearound, and a height of a space inside the main body accommodates multiple folds of the flexible printed circuit in the folded zigzag state.

14. An electronic flash apparatus comprising:
a main body;
an electronic flash unit in that is attached to the main body and requires high voltage where safe distance is required;
a circuit that is stored in the main body and configured to supply an electric power to drive the electronic flash unit; and
a flexible printed circuit configured to electrically connect the electronic flash unit and the circuit to each other,
wherein the flexible printed circuit includes:
a first insulator formed of resin and including a first insulating layer;
a second insulator formed of resin and including a second insulating layer; and
a wiring layer disposed between the first insulating layer and the second insulating layer and formed of a conductive material, the wiring layer to which the high voltage is applied and transmits the electric power to the electronic flash unit,
wherein the flexible printed circuit has a length which is greater than a width and thickness of the flexible printed circuit, the width and the thickness of the flexible printed circuit board being perpendicular to the length, the flexible printed circuit includes a sealed structure in which the wiring layer is enclosed by flexible insulators formed of resin including the first insulator and the second insulator, in a region where insulation of the wiring layer is required, in a cross-section of the region taken along the width direction and the thickness direction of the flexible printed circuit, each of the insulators enclosing the wiring layer meets double insulation or reinforced insulation defined by International Electrotechnical Commission (IEC) 60950, which is an IEC standard, for insulating the wiring layer, so as to meet the IEC standard in both the width direction and the thickness direction, and the sealed structure having the cross-section extends by a predetermined length along a longitudinal direction of the flexible printed circuit.

15. The electronic flash apparatus according to claim 14, wherein the flexible printed circuit is stored in the main body when the electronic flash unit is stored in the main body.

16. The electronic flash apparatus according to claim 14, wherein the flexible printed circuit does not require insulation tape wound therearound to ensure insulation properties complying with the IEC 60950 standard.

17. The electronic flash apparatus according to claim 14, wherein the electronic flash unit is movable between a stored position in the main body and a popped up position extended from the main body, and when the electronic flash unit is stored in the main body the flexible printed circuit is stored in the main body in a folded zigzag state.

18. The electronic flash apparatus according to claim 17, wherein the flexible printed circuit does not include insulation tape wound therearound, and a height of a space inside the main body accommodates multiple folds of the flexible printed circuit in the folded zigzag state.

* * * * *